United States Patent [19]

Motsiff et al.

[11] Patent Number: 5,795,819

[45] Date of Patent: Aug. 18, 1998

[54] INTEGRATED PAD AND FUSE STRUCTURE FOR PLANAR COPPER METALLURGY

[75] Inventors: William Thomas Motsiff, Essex Junction; Robert Michael Geffken, Burlington; Ronald Robert Uttecht, Essex Junction, all of Vt.

[73] Assignee: International Business Machines Corporation, Armonk, N.Y.

[21] Appl. No.: 925,655

[22] Filed: Sep. 9, 1997

Related U.S. Application Data

[62] Division of Ser. No. 671,903, Jun. 28, 1996, Pat. No. 5,731,624.

[51] Int. Cl.⁶ .................. H01L 29/40; H01L 23/48; H01L 23/52
[52] U.S. Cl. .................. 438/618; 438/622; 438/623; 438/626; 438/627; 438/688; 438/687; 438/642
[58] Field of Search .................. 438/618, 622, 438/623, 626, 627, 688, 687, 642; 257/529, 762, 763, 764, 766, 774

[56] References Cited

U.S. PATENT DOCUMENTS

| 3,555,365 | 1/1971 | Forlani et al. | |
|---|---|---|---|
| 3,564,354 | 2/1971 | Aoki et al. | |
| 4,873,506 | 10/1989 | Gurevich | |
| 4,933,303 | 6/1990 | Mo | 438/629 |
| 5,063,175 | 11/1991 | Broadbent | 438/626 |
| 5,389,814 | 2/1995 | Srikrishman et al. | 257/529 |
| 5,512,514 | 4/1996 | Lee | 438/627 |
| 5,559,367 | 9/1996 | Cohen et al. | 257/77 |
| 5,663,590 | 9/1997 | Kapoor | 257/529 |

FOREIGN PATENT DOCUMENTS 0 531 128 A1   3/1993   European Pat. Off.

OTHER PUBLICATIONS

J. E. Cronin et al. "Polysilicon Strap Process for Fuseszz", Kenneth Mason Publications Ltd. England, Mar. 1990, No. 311.

K. B. Albaugh et al. "Fuse Structure for Wide Fuse Materials Choice", vol. 32, No. 3A, Aug. 1989, pp. 438–439.

*Primary Examiner*—Charles L. Bowers, Jr.
*Assistant Examiner*—Thanh Tvguyen
*Attorney, Agent, or Firm*—Whitham, Curtis & Whitham; Howard J. Walter

[57] ABSTRACT

A semiconductor interconnection consists of a corrosion resistant integrated fuse and Controlled, Collapse Chip Connection (C4) structure for the planar copper Back End of Line (BEOL). Non copper fuse material is directly connected to copper wiring.

2 Claims, 2 Drawing Sheets

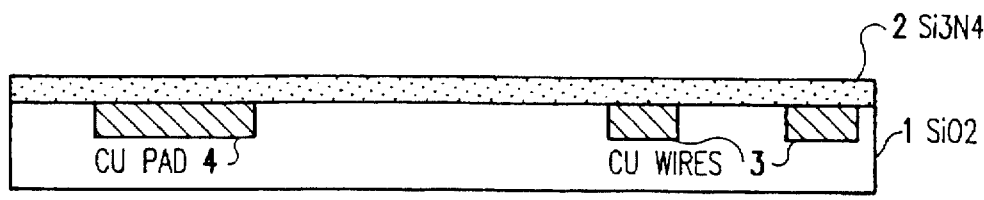
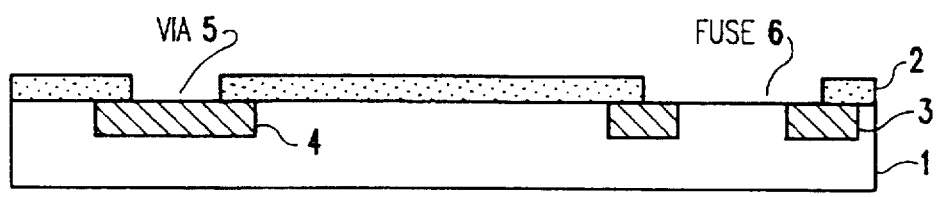
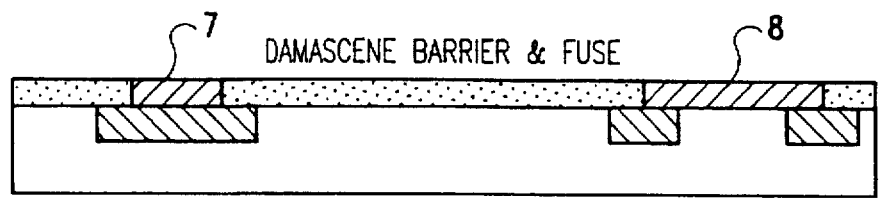
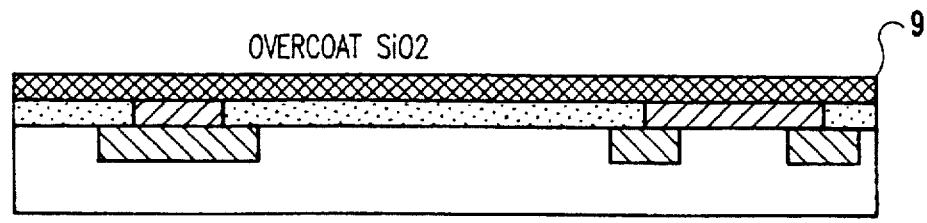
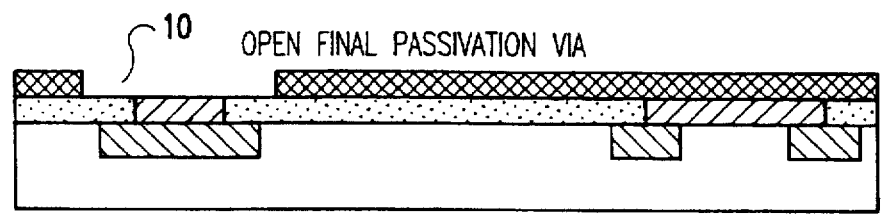
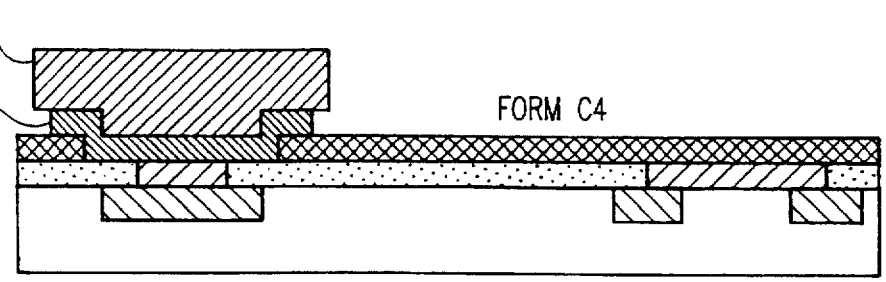
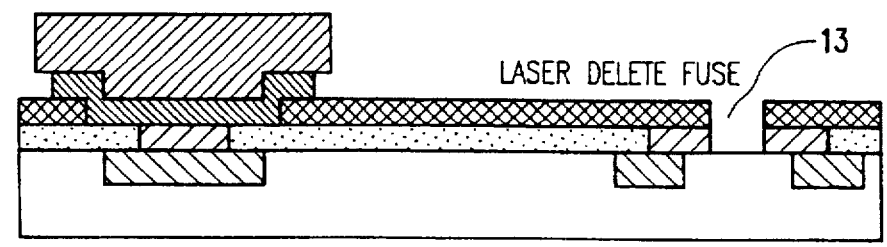

INTEGRATED PAD AND FUSE STRUCTURE FOR PLANAR COPPER METALLURGY

CROSS REFERENCE TO RELATED APPLICATION

This application is a divisional of application Ser. No. 08/671,903 filed Jun. 28, 1996, now U.S. Pat. No. 5,731,624.

BACKGROUND OF THE INVENTION

1. Field of the Invention

The present invention generally relates to semiconductor circuit manufacture and, more particularly, to copper interconnect structures wherein corrosion protection is provided to copper metallurgy.

2. Background Description

Current aluminum and oxide based interconnect structures utilize laser fuse blow of metal interconnect lines for redundancy and identification. The inherently strong passivating oxide formed on aluminum during fuse blow provides excellent corrosion resistance for the blown fuse structure. This is not the case with copper interconnect lines which have a weak passivating oxide and high corrosion susceptibility. The weak passivating oxide and high corrosion susceptibility necessitate a new fuse blow scheme for use with interconnect structures.

U.S. Pat. No. 4,873,506 to Gurevich teaches a non-damascene fuse contacting copper conductors. This is a discrete conventional non-laser blown fuse. Gurevich teaches printing a fuse on the substrate, connecting metallized ends and coating the fuse with a ceramic material.

A suitable fuse and Controlled, Collapse Chip Connection (C4) structure for the planar copper Back End of Line (BEOL) is one of the outstanding issues associated with the manufacturability of the copper BEOL technology. Blown fuses are exposed to an oxidizing ambient and processing chemicals. Since copper readily oxidizes in a non self limiting reaction standard long fuse or short fuse designs used in the oxide/aluminum system have increased risk when translated to the copper BEOL. Additionally, the C4 structure which has proven robust when contacting an aluminum based BEOL structure may not be extendable to copper BEOL structures.

SUMMARY OF THE INVENTION

It is therefore an object of the present invention to provide a corrosion resistant integrated fuse and C4 structure for the planar copper BEOL. The present invention integrates robust fuse and C4 structures into the copper BEOL. The invention comprises a coplanar aluminum damascene fuse and C4 barrier layer in contact with a lower copper conductor layer.

It is further an object to provide a fuse and C4 structure using high reliability components and semiconductor BEOL processing techniques, e.g., damascene methods and aluminum or titanium tungsten base metallurgies.

A coplanar damascene fuse and C4 barrier are formed by depositing a passivating film having a thickness equal to the desired fuse thickness over the last copper wiring layer. Etching is used to define the via for the C4 connection and to define the trench in which the fuse will be formed. The metallurgy layer which will form the fuse and barrier is deposited, contacting the last copper wiring layer that was exposed by the previous etching step. Unwanted barrier/fuse metallurgy is removed and a final passivation layer applied.

Etching is used to define a via in the final passivation layer which allows the C4 to contact the C4 barrier layer. The C4 is then formed by conventional means.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A through 1G are cross-sections of an integrated fuse and C4 structure as the fuse is being prepared.

DETAILED DESCRIPTION OF A PREFERRED EMBODIMENT OF THE INVENTION

Figure 2:
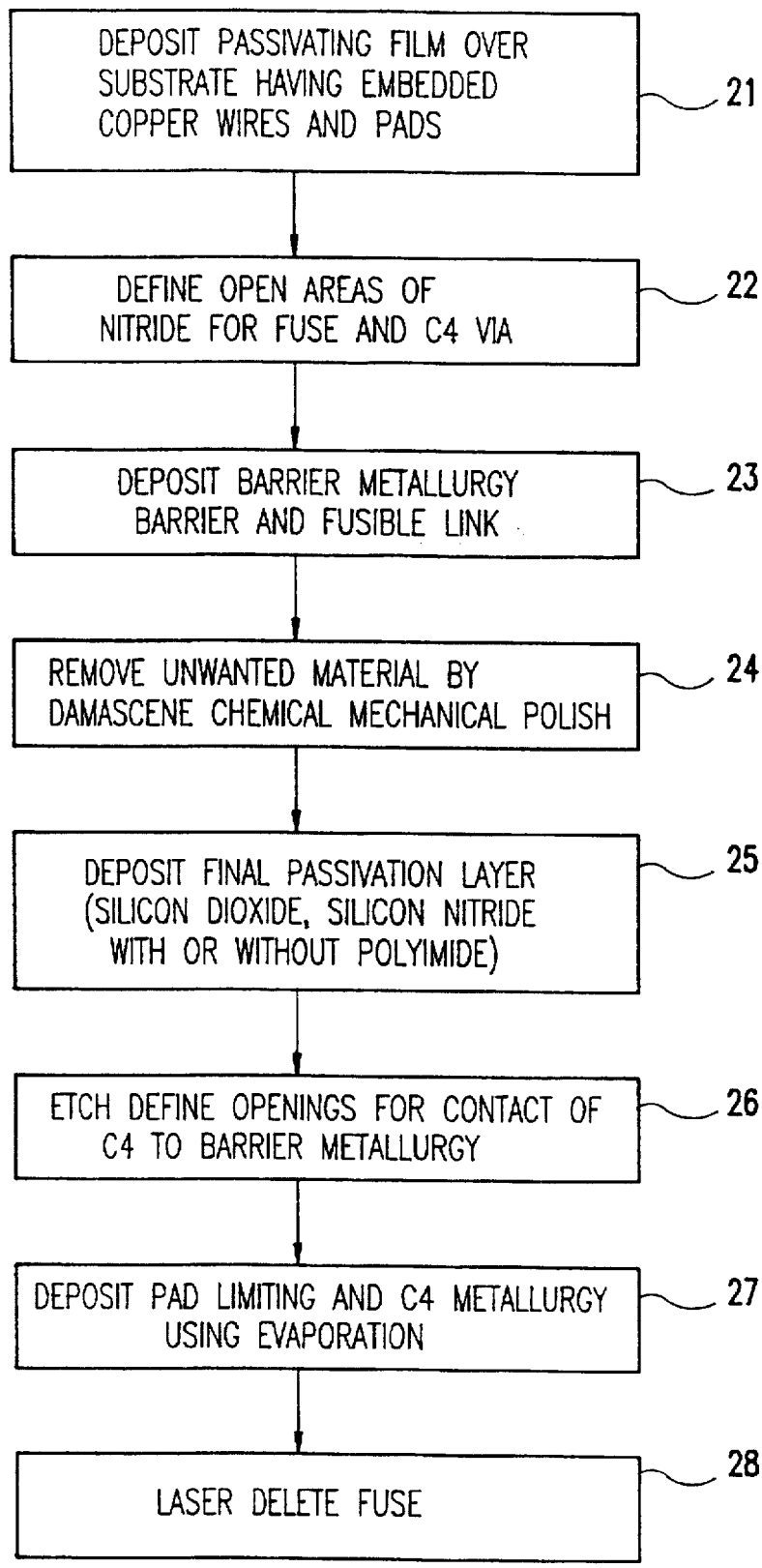
FIG. 2 is a flow diagram of the steps of this invention.

Referring now to the drawings, and more particularly to FIG. 1A, there is shown a cross-section of a silicon oxide substrate 1 with an over layer 2 of silicon nitride ($Si_3N_4$) having a thickness equal to the desired fuse and barrier thickness. While silicon oxide and silicon nitride are the examples used in the embodiment being described, those skilled in the art will understand that other appropriate dielectric materials can be used. Planar copper wires 3 and pad 4 are embedded in the substrate dielectric material 1 as would be formed with a damascene technique.

FIG. 1B shows the same cross-section following standard photoresist and etch techniques where open areas in the nitride for fuse 6 and C4 barrier 5 are defined. In FIG. 1C, a material suitable for use as a C4 barrier 7 and a fuse 8 is deposited and defined. Examples of suitable materials include titanium-tungsten and aluminum. Unwanted material is removed by damascene Chemical Mechanical Polish (CMP) or other suitable technique.

A suitable final passivation layer 9 is added as shown in FIG. 1D. Examples of suitable final passivation layers include silicon dioxide, silicon nitride, or a mixture of silicon dioxide and silicon nitride. In FIG. 1E, an opening 10 is defined, using standard photoresist and etch techniques, in the final passivation layer above the C4 barrier structures. C4 Pad Limiting Metallurgies (PLM) 11 consisting for example of chromium, copper, and gold, and C4 metallurgies 12 consisting for example of lead and tin are deposited using standard metallization techniques, e.g. evaporation through a metal mask, as shown in FIG. 1F. Those skilled in the art should recognize that other PLM metallurgies such as TiWCu, other C4 metallurgies and deposition techniques (e.g. electroplating) can be used. At this point, the semiconductor integrated circuit device is ready for electrical test and fuse blow. In FIG. 1G, laser fuse blow has occurred with the fuse being deleted at 13.

The steps of the inventive technique are shown in the flow chart of FIG. 2. First, in box 21, a substrate, having embedded copper wires, pad and passivating film (FIG. 1A) is provided. In the second step, shown in box 22, a standard photoresist etch is performed to define fuse and C4 barrier openings (FIG. 1B). Next, as shown in box 23, the fuse and C4 barrier are deposited, followed in box 24 by damascene chemical mechanical polishing to remove the unwanted material (FIG. 1C). Fourth, as shown in box 25, a final passivation layer is deposited (FIG. 1D). The final passivation layer is etched above the C4 barrier structures in the fifth step (FIG. 1E), as shown in box 26. PLM and C4 metallurgies are then deposited (FIG. 1F), as shown in box 27. In the final step, shown in box 28, fuse delete occurs (FIG. 1G).

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of making an interconnection structure for a semiconductor circuit comprising the steps of:

provinding a substrate having coplanar damascene non-self-passivating conductors embedded in a first insulator defining a first electrical interconnect layer;

forming second electrical interconnect layer comprising coplanar self-passivating conductors in a second insulator, said second electrical interconnect layer overlying said first electrical interconnect layer and said second interconnect self-passivating conductors contacting said non-self-passivating conductors; and depositing a final passivation layer over said second electrical interconnect layer.

2. The method of making an interconnection structure of claim 1, wherein one of said self-passivating conductors (in contact with one of said non-self-passivating conductors) forms part of a Controlled, Collapse Chip Connection (C4) barrier structure, the method further comprising the steps of:

etching the final passivation layer above the C4 barrier structure; and depositing pad limiting and C4 metallurgies.

* * * * *